(12) United States Patent
Choi et al.

(10) Patent No.: US 11,233,093 B2
(45) Date of Patent: Jan. 25, 2022

(54) HEAD MOUNTED DISPLAY DEVICE AND DISPLAY PANEL INCLUDED THEREIN

(71) Applicant: LG Display Co., Ltd., Seoul (KR)

(72) Inventors: Hong-Seok Choi, Seoul (KR);
Yoon-Deok Han, Yongin-si (KR);
Gyeong-Woo Kim, Seoul (KR);
Jun-Ho Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 134 days.

(21) Appl. No.: 16/516,549

(22) Filed: Jul. 19, 2019

(65) Prior Publication Data
US 2020/0027932 A1     Jan. 23, 2020

(30) Foreign Application Priority Data
Jul. 20, 2018  (KR) .......................... 10-2018-0084852

(51) Int. Cl.
*H01L 27/32* (2006.01)
*G02B 27/01* (2006.01)
*H01L 51/52* (2006.01)

(52) U.S. Cl.
CPC ...... *H01L 27/3213* (2013.01); *G02B 27/0172* (2013.01); *H01L 27/322* (2013.01); *H01L 51/5271* (2013.01); *G02B 2027/0178* (2013.01)

(58) Field of Classification Search
CPC ............... H01L 27/322; H01L 27/3209; H01L 27/3211; H01L 27/3213; H01L 51/5036; H01L 51/504; H01L 51/5044; H01L 27/3206–3213; H01L 27/3216; H01L 27/3218; H01L 51/5271; H01L 51/5265; H01L 51/5218
See application file for complete search history.

(56) References Cited

U.S. PATENT DOCUMENTS

| | | | | |
|---|---|---|---|---|
| 9,570,519 B2* | 2/2017 | Lee | ...................... | H01L 27/3211 |
| 2003/0201415 A1* | 10/2003 | Hoag | .................. | H01L 51/0035 |
| | | | | 251/40 |
| 2011/0062475 A1* | 3/2011 | Cho | ..................... | H01L 51/5265 |
| | | | | 257/98 |
| 2012/0223346 A1* | 9/2012 | Ohsawa | ................ | H01L 27/322 |
| | | | | 257/89 |

(Continued)

FOREIGN PATENT DOCUMENTS

| | | | |
|---|---|---|---|
| EP | 3109253 A1 * | 12/2016 | ............. C09K 11/06 |
| KR | 20180078641 A * | 7/2018 | |

OTHER PUBLICATIONS

Machine translation of KR-20180078641-A (Year: 2018).*

*Primary Examiner* — Amar Movva
(74) *Attorney, Agent, or Firm* — Polsinelli PC

(57) ABSTRACT

A head mounted display device comprises a display panel comprising first to third subpixels defined at a substrate, a reflection plate provided in the first, second and third subpixels, first electrodes vertically spaced apart from a lower surface of the reflection plate by a first distance, a second distance and a third distance at the first, second and third subpixels, respectively, a white organic stack on the first electrodes at the first, second and third subpixels, a second electrode on the white organic stack, and a first color filter on the second electrode at the third subpixel to transmit light having a long wavelength.

20 Claims, 9 Drawing Sheets

(56) References Cited

U.S. PATENT DOCUMENTS

| | | | |
|---|---|---|---|
| 2015/0187848 A1* | 7/2015 | Kim | H01L 51/5016 |
| | | | 257/40 |
| 2017/0062751 A1* | 3/2017 | Park | H01L 51/5278 |
| 2017/0213876 A1* | 7/2017 | Ohsawa | H01L 51/5203 |
| 2017/0229676 A1* | 8/2017 | Shiratori | H01L 51/5265 |
| 2018/0122875 A1* | 5/2018 | Bang | H01L 27/323 |
| 2018/0166511 A1* | 6/2018 | Niboshi | H01L 51/0009 |
| 2018/0269417 A1* | 9/2018 | Sudo | H01L 51/0052 |

* cited by examiner

HEAD MOUNTED DISPLAY DEVICE AND DISPLAY PANEL INCLUDED THEREIN

CROSS-REFERENCE TO RELATED APPLICATION

This application claims the benefit of Korean Patent Application No. 10-2018-0084852, filed on Jul. 20, 2018, which is hereby incorporated by reference in its entirety.

BACKGROUND

Field of the Disclosure

The present disclosure relates to a display device, and more particularly, to a head mounted display device and a display panel included therein. Although the present disclosure is suitable for a wide scope of applications, it is particularly suitable for achieving high luminance and high integration for the head mounted display device that has a fixed distance between a display surface and a viewer.

Description of the Background

With the advent of the information age, the field of displays which visually display electrical information signals has rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD) device, a plasma display panel (PDP) device, a field emission display (FED) device, an organic light emitting diode (OLED) display device, a quantum dot display device, etc.

Thereamong, self-luminous display devices which do not require separate light sources and can achieve compactness and clear color display, such as an organic light emitting diode display device, are preferred.

An application field of display devices gradually extends not only to a monitor and a TV but also to a wearable type which is worn by a viewer so as to be movable with the viewer. Further, a display device which displays an image in a state in which it is worn by a viewer is included in an apparatus mounted on a viewer's head. Such a display device is pressed against the viewer, and an area in which the display device is disposed is limited to a restricted physical space, thus simultaneously requiring integration to achieve clear display having a high resolution and high luminance.

Such a wearable or head mounted display device shows different tendencies from viewing angle and luminance characteristics and an arrangement density of a large-scale display device, and thus requires development of a different device structure to achieve high integration and high luminance characteristics.

Up until now, organic light emitting display devices, characteristics of which are changed according to a viewing angle, i.e., a large-scale display device, such as a TV and a general-purpose display device, such as a monitor, a mobile phone and a tablet, are focused. Wearable or head mounted display devices are provided to implement virtual reality or augmented reality, and require implementation of high integration and high luminance within a restricted area so as to implement an image close to an actual image. Therefore, research on high integration and high luminance satisfying requirements of the wearable or head mounted display devices is carried out, but it is difficult to simultaneously implement both high integration and high luminance and luminance characteristics according to colors are different due to limits on materials.

SUMMARY

Accordingly, the present disclosure is directed to a head mounted display device and a display panel included therein that substantially obviate one or more problems due to limitations and disadvantages of the related art.

The present disclosure is to provide a head mounted display device in which a distance between a display surface and a viewer is fixed to achieve both high luminance and high integration, and a display panel included therein.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a head mounted display device comprises a display panel comprising first to third subpixels defined at a substrate; a reflection plate provided in the first, second and third subpixels; first electrodes vertically spaced apart from a lower surface of the reflection plate by a first distance, a second distance and a third distance at the first, second and third subpixels, respectively; a white organic stack on the first electrodes at the first, second and third subpixels; a second electrode on the white organic stack; a first color filter on the second electrode at the third subpixel to transmit light having a wavelength in a range of 600 nm to 650 nm; and a receipt structure accommodating the display panel.

The white organic stack may include a first stack including a first light emitting layer to emit light having a peak wavelength of 435 nm to 475 nm and a first common layer and a second common layer under and on the first light emitting layer, a charge generation layer to contact the second common layer, and a second stack on the charge generation layer and including a second light emitting layer to emit light having a peak wavelength of 600 nm to 650 nm, a third light emitting layer configured to contact the second light emitting layer and to emit light having a peak wavelength of 500 nm to 590 nm, a third common layer under the second light emitting layer and a fourth common layer provided on the third light emitting layer.

In the first subpixel, the white organic stack may emit light to have a single strong cavity characteristic, emitted from the first light emitting layer, through the second electrode.

A thickness of the white organic stack may be m/2 times (m being a integer) a value acquired by dividing a wavelength of light emitted from the first light emitting layer by a refractive index of the white organic stack.

The substrate may be fixed at a designated distance from a viewer's eye.

The first light emitting layer may include a blue dopant having a full width at half maximum (FWHM) of 20 nm to 35 nm.

The first light emitting layer may include a boron-based blue dopant.

The first distance may be a thickness of the reflection plate, the reflection plate and the first electrode may contact each other in the first subpixel, and a transparent inorganic film may be further provided between the reflection plate and the first electrode in the second subpixel and the third subpixel.

The head mounted display device may further include a second color filter on the second electrode in the second subpixel to be coplanar with the first filter so as to transmit light of a wavelength of 530 nm to 570 nm.

The head mounted display device may further include a transparent film having transmittance of 85% or more, on the second electrode in the first subpixel to be coplanar with the first color filter.

The head mounted display device may further include a capping layer and an encapsulation layer stacked on the second electrodes in the first to third subpixels, and the first color filter may contact the encapsulation layer.

The display panel may include a first display panel and a second display panel provided within the receipt structure to correspond to both of viewer's eyes.

The head mounted display device may further include first and second lens units provided between the first and second display panels and the viewer's eyes to converge images on the viewer's eyes.

The first and second display panels may be provided at both sides of the viewer's eyes within the receipt structure, and the head mounted display device may further include first and second reflecting mirrors configured to transmit images emitted by the first and second display panels to the first and second lens units through reflection.

The substrate may be one of a transparent glass substrate, a transparent plastic substrate and a silicon substrate.

The head mounted display device may further include driving thin film transistors connected to the first electrodes, in the first to third subpixels.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
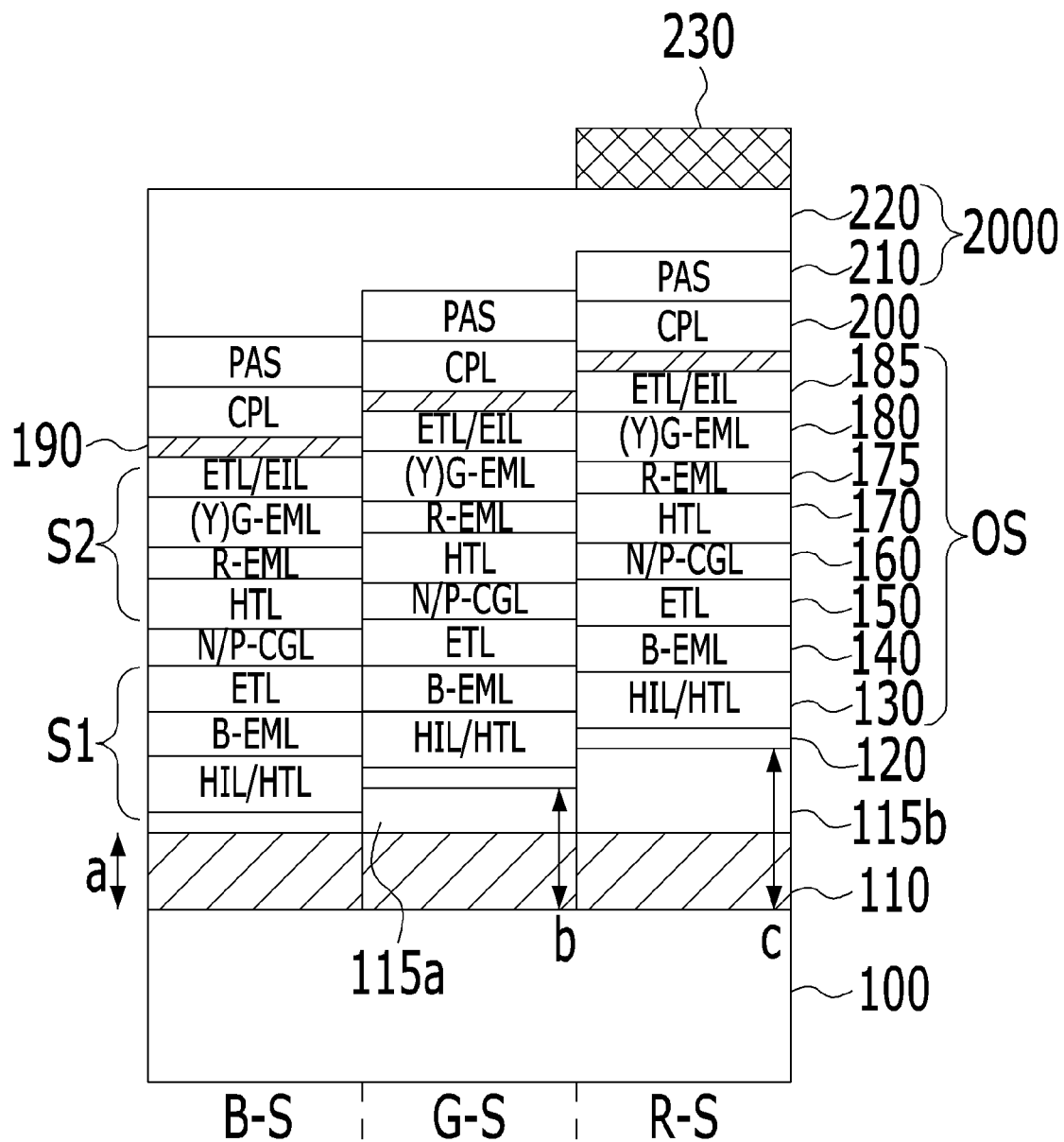
FIG. 1 is a cross-sectional view illustrating an organic light emitting device array in accordance with a first aspect of the present disclosure.

Reference will now be made in detail to the various aspects of the present disclosure, examples of which are illustrated in the accompanying drawings. However, the present disclosure may be embodied in many alternative forms and should not be construed as limited to the aspects set forth herein, and the aspects of the present disclosure are provided only to completely disclose the disclosure and to completely inform those skilled in the art of the scope of the disclosure. Further, the names of elements used in the following description of the aspects of the present disclosure are selected in consideration of ease in preparation of the specification, and may thus differ from the names of parts of an actual product.

Shapes, sizes, rates, angles, numbers, etc. disclosed in the drawings to describe the aspects of the present disclosure are only exemplary and do not limit the present disclosure. In the following description of the aspects and the drawings, the same or similar elements are denoted by the same reference numerals even though they are depicted in different drawings. In the following description of the aspects of the present disclosure, a detailed description of known functions and configurations incorporated herein will be omitted when it may make the subject matter of the present disclosure rather unclear. In the following description of the aspects, the terms 'including', 'having', 'consisting of', etc. will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element includes a plural expression of the element unless stated otherwise.

In interpretation of elements included in the various aspects of the present disclosure, it will be interpreted that the elements include error ranges even if there is no clear statement.

In the following description of the aspects, it will be understood that, when positional relations are expressed, for example, when an element is 'on', 'above', 'under', 'beside', etc. another element, the two elements may directly contact each other, or one or more other elements may be interposed between the two elements unless the term 'just' or 'directly' is used.

In the following description of the aspects, it will be understood that, when temporal relations are expressed, for example, a term expressing a sequence of events, such as 'after', 'subsequent to', 'next to' or 'before' may encompass continuous relationship between the events, or discontinuous relationship between the events unless the term 'just' or 'directly' is used.

In the following description of the aspects, it will be understood that, when the terms 'first', 'second', etc. are used to describe various elements, these terms are used merely to discriminate the same or similar elements. Therefore, an element modified by the term 'first' may be the same as an element modified by the term 'second' within the technical scope of the disclosure unless stated otherwise.

Characteristics of the various aspects of the present disclosure may be partially or entirely connected to or combined with each other and technically variously driven and interlocked with each other, and the respective aspects may be independently implemented or be implemented together in connection with each other.

First, among terms which will be described below, an organic light emitting device array and a display panel will be described.

In the following description of the aspects of the present disclosure, the organic light emitting device array refers to an array of a plurality of subpixels having organic light emitting devices which emit light of different colors, provided on a substrate in consideration of optical characteristics, and the display panel includes driving thin film transistors respectively provided in the subpixels so as to drive the respective subpixels of the organic light emitting device array.

In a head mounted display device in accordance with the present disclosure, two display panels are provided corresponding to both of viewer's eyes.

FIG. 1 is a cross-sectional view illustrating an organic light emitting device array in accordance with a first aspect of the present disclosure.

As exemplarily shown in FIG. 1, the organic light emitting device array in accordance with the first aspect of the present disclosure includes a substrate 100 having first to third subpixels B-S, G-S and R-S, a reflection plate 110 provided at the first to third subpixels B-S, G-S and R-S, first electrodes 120 located to be vertically spaced apart from the lower surface of the reflection plate 110 by gradually increased first distance a, second distance b and third distance c, in the first to third subpixels B-S, G-S and R-S, a white organic stack OS provided on the first electrodes 120 in the first to third subpixels B-S, G-S and R-S, a second electrode 190 provided on the white organic stacks OS, and a first color filter 230 provided on the second electrode 190 in the third subpixel R-S to transmit light of a wavelength of 600 nm to 650 nm.

Here, in each of the first to third subpixels B-S, G-S and R-S, the white organic stack OS having the same layered structure is provided between the first electrode 120 and the second electrode 190, but the vertical distance between the lower surface of the reflection plate 110 and the first electrode 120 is varied (i.e., a first distance a, a second distance b and a third distance c) so that an optimal light emission between the reflection plate 110 and the second electrode 190 can be achieved and a wavelength having fine resonance effects is varied.

The reflection plate 110 is formed of a reflective metal such as Ag, an Ag alloy, Al, an Al alloy and APC (Ag:Pb: Cu), and functions as a mirror, and the second electrode 190 is formed of AgMg or an alloy including AgMg or is a transparent oxide film formed of indium tin oxide (ITO) or indium zinc oxide (IZO), functions as a half mirror, amplifies and transmits light of only a specific wavelength determined by a resonance distance formed under the second electrode 190 and repeats reflection of light of remaining wavelengths with the reflection plate 110.

In the present disclosure, in order to improve reflection characteristics between the second electrode 190 and the reflection plate 110 and to increase strong cavity characteristics according to the resonance distance of each subpixel, the second electrode 190 may be formed of AgMg or an alloy including AgMg.

Therefore, when light emitting layers of the white organic stack OS of each of the first to third subpixels B-S, G-S and R-S emit light, light transmitted upward and downward from the light emitting layers is repeatedly reflected by the surface of the reflection plate 110 and the second electrode 190, and light of a specific wavelength corresponding to the distance from the lower surface of the reflection plate 110 to the second electrode 190 may be concentratedly emitted to the second electrode 190 through strong microcavity effects. In this case, when a distance between the upper surface of the reflection plate 110 and the second electrode 190 is referred to as d in each of the respective sub-pixels B-S, G-S and R-S, an equation $2nd=m\lambda$ is formed (where n is a mean refractive index of the white organic stack OS, m is an integer, and $\lambda$ is a wavelength of light emitted by the second electrode 190 in the corresponding pixel through microcavity effects). That is, in order to allow the first to third sub-pixels B-S, G-S and R-S to emit light of different colors, the first electrodes 120 are located to be vertically spaced apart from the lower surface of the reflection plate 110 by the first distance a, the second distance b and the third distance c. The first distance a corresponds to the thickness of the reflection plate 110, and thus the upper surface of the reflection plate 110 contacts the first electrode 120 in the first subpixel B-S. In each subpixel, reflection of light is performed from the upper surface of the reflection plate 110, and, according to presence of first or second transparent inorganic films 115a and 115b, light resonated between the reflection plate 110 and the second electrode 190 to have a different resonance distance from that of light in the first subpixel B-S is emitted.

The second distance b and the third distance c are longer than the first distance a, the third distance c is longer than the second distance b, and the second distance b and the third distance c are adjusted by varying the thicknesses of the transparent inorganic films 115a and 115b provided between the reflection plate 110 and the first electrode 120 in the second subpixel G-S and the third subpixel B-S.

The transparent inorganic films 115a and 115b have a refractive index difference of 0.3 or less with the first electrode 120 so that a most part of light penetrates the first and second transparent inorganic films 115a and 115b during resonance of light between the reflective plates 110 and the second electrodes 190, and the thickness of each of the transparent inorganic films 115a and 115b is added to the thickness of the white organic stack OS and thus used to determine a resonance wavelength of the corresponding subpixel.

In this case, the first electrode 120 is a transparent oxide electrode including indium tin oxide (ITO) or indium zinc oxide (IZO) or a nitride electrode including titanium (Ti), zinc (Zn), indium (In) or the like, has excellent interfacial matching with a first common layer 130 of the white organic stack OS which is formed first of all, transparency and a work function which is the same as or similar to that of ITO, and directly enhances morphology at the interface with an organic layer through surface treatment in most cases. Further, the first electrode 120 may be formed of the same material as the second electrode 190 in some cases, and has a very short distance from the reflection plate 110 and thus serves to directly transmit light upwards from the reflection plate 110 or directly transmit light downwards from the second electrode 190 through both surfaces of the first electrode 120 rather than to reflect light.

In the organic light emitting device array in accordance with the present disclosure, the white organic stack OS includes a plurality of organic layers, and particularly, includes different light emitting stacks, i.e., a first stack S1 and a second stack S2 which are divided by a charge generation layer (N/P-CGL) 160.

In the organic light emitting device array in accordance with the present disclosure, the white organic stack OS is characterized in that the respective organic layers are formed to cover the entirety of the subpixels in common without distinction among the subpixels. In the organic light emitting device array in accordance with the present disclosure, the substrate 100 is located close to each of viewer's eyes, a distance between the substrate 100 and the viewer's eye is fixed by a receipt apparatus in which the organic light emitting device array is mounted, and thus the substrate 100 has a small size of about 3 inches or less in consideration of eye movement and sensing of an image by the eye. Further, in order to implement an image corresponding to virtual reality and augmented reality in a head mounted display device, 1000 or more pixels (one pixel including three or more subpixels) need to be disposed in the above-described small area, and, in this case, each subpixel should have a width of less than 10 μm.

In such a high-resolution and high-integration organic light emitting device array (display panel), in order to form different hole/electron transport layers or light emitting layers in the respective subpixels, different deposition masks according to colors of the respective transport layers and light emitting layers are required. A deposition process of organic material using a deposition mask is carried out by depositing vaporized organic material using the deposition mask located in a non-contact type to be spaced apart from a substrate. Here, it is difficult to manufacture the deposition mask having openings having a fine width, and, even if the deposition mask having the fine openings is used, the openings and deposition regions do not completely correspond to each other due to interference at the edges of the openings and thus the organic material may be deposited on a larger area than the opening or a deposition thickness at the edge of the opening may be varied. Thereby, when misalignment between the deposition mask and the substrate occurs, deposition of the organic material at a wrong position or a thickness difference of the deposited organic material in the same light emitting area causes yield reduction.

Therefore, in the organic light emitting device array used in a mounted display device requiring miniaturization and high integration, light emitting layers are not divided according to the subpixels, a plurality of stacks, each of which includes light emitting layers, is applied to all the subpixels, and, as described above, by varying the distances a, b and c between the lower surface of the reflection plate 110 and the second electrode 190 in the respective subpixels B-S, G-S and R-S due to provision of the transparent inorganic films 115a and 115b, the vertical distances in which light is resonated in the corresponding subpixels are adjusted so as to vary selective microcavity wavelength characteristics.

For example, the white organic stack OS includes the first stack S1 including a first light emitting layer (B-EML) 140 to emit light having a peak wavelength of 435 nm to 475 nm and a first common layer (HIL/HTL) 130 and a second common layer (ETL) 150 provided under and on the first light emitting layer (B-EML) 140, the charge generation layer (N/P-CGL) 160 contacting the second common layer (ETL) 150, and the second stack S2 provided on the charge generation layer (N/P-CGL) 160 and including a second light emitting layer (R-EML) 175 to emit light having a peak wavelength of 600 nm to 650 nm, a third light emitting layer ((Y)G-EML) 180 contacting the second light emitting layer (R-EML) 175 to emit light having a peak wavelength of 500 nm to 590 nm, a third common layer (HTL) 170 provided under the second light emitting layer (R-EML) 175 and a fourth common layer (ETL/EIL) 185 provided on the third light emitting layer ((Y)G-EML) 180.

In FIG. 1, the first subpixel B-S emits blue light, the second subpixel G-S emits green light, and the third subpixel R-S emits red light. However, the present disclosure is not limited thereto and the second subpixel G-S may emit light of a similar wavelength range, such as yellowish green light and yellow light or the like.

A color of light emitted by each subpixel is determined by characteristics of dopants provided in the first to third emitting light layers (B-EML, R-EML, (Y)G-EML) 140, 175 and 180. The second light emitting layer (R-EML) 175 may include a red dopant having a peak wavelength of 600 nm to 650 nm, and the third light emitting layer ((Y)G-EML) 180 may include a green, yellowish green or yellow dopant having a peak wavelength of 500 nm to 590 nm. In each of the first to third light emitting layers (B-EML, R-EML, (Y)G-EML) 140, 175 and 180, a dopant having a wavelength corresponding to the color of light emitted thereby is included in one or more hosts, and the respective hosts transmit energy to the dopant so as to excite the dopant.

Particularly, the first light emitting layer (B-EML) 140 of the organic light emitting device array in accordance with the present disclosure uses a blue fluorescent dopant, and the blue fluorescent dopant has a peak wavelength of 435 nm to 475 nm and thereby emit light of blue close to deep blue. The blue dopant has luminescent properties which have an intensity of 50% or more of the intensity of the peak wavelength within a narrow full width at half maximum (FWHM) of 20 nm to 35 nm, and light in a narrow wavelength range of deep blue emitted by the first light emitting layer (R-EML) 140 is finely resonated in the distance between the reflection plate 110 and the second electrode 190 in the first subpixel B-S, amplified and thus emitted to the second electrode 190. Particularly, an optical member to restrict light intensity, such as a color filter, is not provided on the upper surface of the second electrode 190 in the first subpixel B-S, and the reason for this is that light emitted by the first subpixel B-S through the second electrode 190 is light of a single or an almost single wavelength in a narrow FWHM, emitted from the first light emitting layer 140 to have strong microcavity characteristics and thus it is not necessary to filter out light of wavelengths in other ranges than the deep blue range. Therefore, a color filter may be omitted from the first subpixel B-S, blue light emitted to the second electrode 190 through the white organic stack OS in the first subpixel B-S may be completely used without loss and thus luminance increase effects may be acquired. Here, a thickness (d) of the white organic stack OS may become the optimal resonance distance of the first subpixel B-S, and the thickness (d) may be about m/2 times (m being an integer) a value acquired by dividing the wavelength ($\lambda b$)

of light emitted by the first light emitting layer (R-EML) 140 by the mean refractive index (n) of the white organic stack OS (d=m*λb/2n).

On the other hand, the first color filter (also referred to as the red color filter) 230 is provided on the upper surface of the second electrode 190 of the third subpixel R-S. A distance from the reflection plate 110 to the second electrode 190 in the third subpixel R-S is greater than the distance in the first subpixel B-S due to provision of the second transparent organic film 115b in the third subpixel R-S. Here, the thickness of the second transparent organic film 115b may be determined so that an integer multiple of a wavelength (λr) of red light is equal to a value acquired by multiplying the distance (dr) from the reflection plate 110 to the second electrode 190 in the third subpixel R-S by the mean refractive index (n) of the white organic stack OS and then by 2 (2n*dr=ma*λr). Due to the thickness of the second transparent inorganic film 115b, an integer multiple of the red wavelength (λr) corresponding to a long wavelength (ma*λr) may be equal to an integer multiple of the blue wavelength (λb) corresponding to a short wavelength (mb*λb), and this means that light amplified by the distance between the reflection plate 110 and the second electrode 190 in the third subpixel R-S and emitted through the second electrode 190 may cause blue wavelength interference. That is, since light of a plurality of wavelengths may be emitted from the same subpixel, the red color filter 230 to transmit red light and to absorb light of wavelengths other than red light is provided in the third subpixel R-S.

Further, a color filter is not provided also in the second subpixel G-S of the organic light emitting device array in accordance with the first aspect of the present disclosure. The first transparent inorganic film 115a has a smaller thickness than the thickness of the second transparent inorganic film 115b, a difference in the resonance distances between the first subpixel B-S and the second subpixel G-S is small and thus it is easy to allow an integer multiple of a green wavelength (mc*λg) to be different from the integer multiple of the blue wavelength (mc*λb) (overlapping of the optimal resonance distances of the first and second subpixels is avoidable), and, even if light of the green wavelength in a wide range is emitted to the second electrode 190 in the second subpixel G-S, a visible range of green light is wide and thus it is visibility of light of other colors is not high. Further, in the first to third light emitting layers (B-EML, R-EML, (Y)G-EML) 140, 175 and 180 of the white organic stack OS, by increasing a green (or yellowish green or yellow) dopant content of the third light emitting layer (G-EML or YG-EML) 180 which emits green light (or yellowish green or yellow light) as compared to a blue dopant content and a red dopant content of the first and second light emitting layers 140 and 175 (B-EML and R-EML), luminous efficacy of white light of the organic light emitting device array depends heavily on luminous efficacy of green light (or yellowish green or yellow light), and even if light of other colors is partially emitted from the second subpixel G-S, visibility thereof is lowered and thus use of a green color filter may be omitted.

In the organic light emitting device array of FIG. 1, the first and second transparent inorganic films 115a and 115b may be formed by patterning the same transparent inorganic material using masks in which transmissive areas and transflective areas are different.

Further, the first and second transparent inorganic films 115a and 115b may be, for example, transparent inorganic insulating films, such as oxide films or nitride films, or electrodes having transparency. In the latter case, the reflection plate 110, the first transparent organic film 115a or the second transparent organic film 115b, and the first electrode 120 form a stacked structure and are in surface contact with one another, and thus sheet resistance of the first electrode 120 is lowered.

Further, in FIG. 1, non-described reference numeral CPL 200 is a capping layer in which an organic layer and an inorganic layer are stacked, and non-described reference numeral 2000 is an encapsulation layer formed by alternately stacking at least a pair of an inorganic film (PAS) 210 and an organic film 220.

The inorganic film PAS 210 and the organic film 220 of the encapsulation layer 2000 may respectively have thicknesses which are two or more times the thickness of each layer of the lower structure including the capping layer 200 so as to sufficiently cover and protect the lower structure. Particularly, the organic film 220 of the encapsulation layer 2000 may have a thickness which is ten or more times the thickness of each layer of the lower structure including the capping layer 200, and thus, even if particles are generated or inner outgassing occurs during processes, stably cover the particles and gas without flow thereof and prevent reduction in the lifespan of the organic light emitting device array caused by the particles or outgassing. Although FIG. 1 illustrates the encapsulation layer 2000 as including a single inorganic film PAS 210 and a single organic film 220, the encapsulation layer 2000 is not limited thereto and may include a plurality of pairs or N·5 pairs (N being a natural number) of inorganic and organic films which are alternately disposed such that the inorganic film is disposed as the uppermost film in the encapsulation layer 2000. The inorganic film PAS 210 of the encapsulation layer 2000 may be an oxide film or a nitride film, or include a small amount of a metal component having coverage, for example, aluminum, added to the oxide or nitride film so as to maintain transparency, and have a thickness of about 1 μm or so. The organic film 220 of the encapsulation layer 2000 may be formed of organic material to have a thickness of about 10 μm or so. In the encapsulation layer 2000, the inorganic film PAS 210 has a greater area than the organic film 220 so that the inorganic film PAS 210 may prevent permeation of moisture from the outside.

In the first stack S1 of the white organic stack OS, the first common layer 130 has a hole injection function of assisting injection of holes from the first electrode 120 and a hole transport function of transmitting the injected holes to the first light emitting layer 140. Thus, the first common layer 130 may have a hole injection layer HIL and a holt transport layer HTL. The first light emitting layer 140 may be a blue emitting layer B-EML.

Further, the second common layer 150 has a function of transporting electrons transmitted from the charge generation layer (N/P-CGL) 160 to the first light emitting layer 140. Thus, the second layer 150 is also called as an electron transport layer ETL.

Further, the charge generation layer (N/P-CGL) 160 may be formed by stacking an n-type charge generation layer n-CGL and a p-type charge generation layer p-CGL, or be formed as a single layer.

Further, in the second stack S2, the third common layer 170 has a function of transporting holes transmitted from the charge generation layer (N/P-CGL) 160 to the second light emitting layer (R-EML) 175, the third emitting layer (G-EML or YG-EML) 180 and the fourth common layer (ETL/EIL) 185 has a function of assisting injection of electrons from the second electrode 190 and transporting the injected electrons to the third light emitting layer 180.

The first to fourth common layers (HIL/HTL, ETL, HTL, ETL/EIL) 130, 150, 170 and 185 may be divided into a plurality of layers according to functions.

Hereinafter, characteristics of the blue dopant applied to the first light emitting layer (B-EML) 140 of the organic light emitting device array in accordance with the present disclosure will be described.

Figure 2:
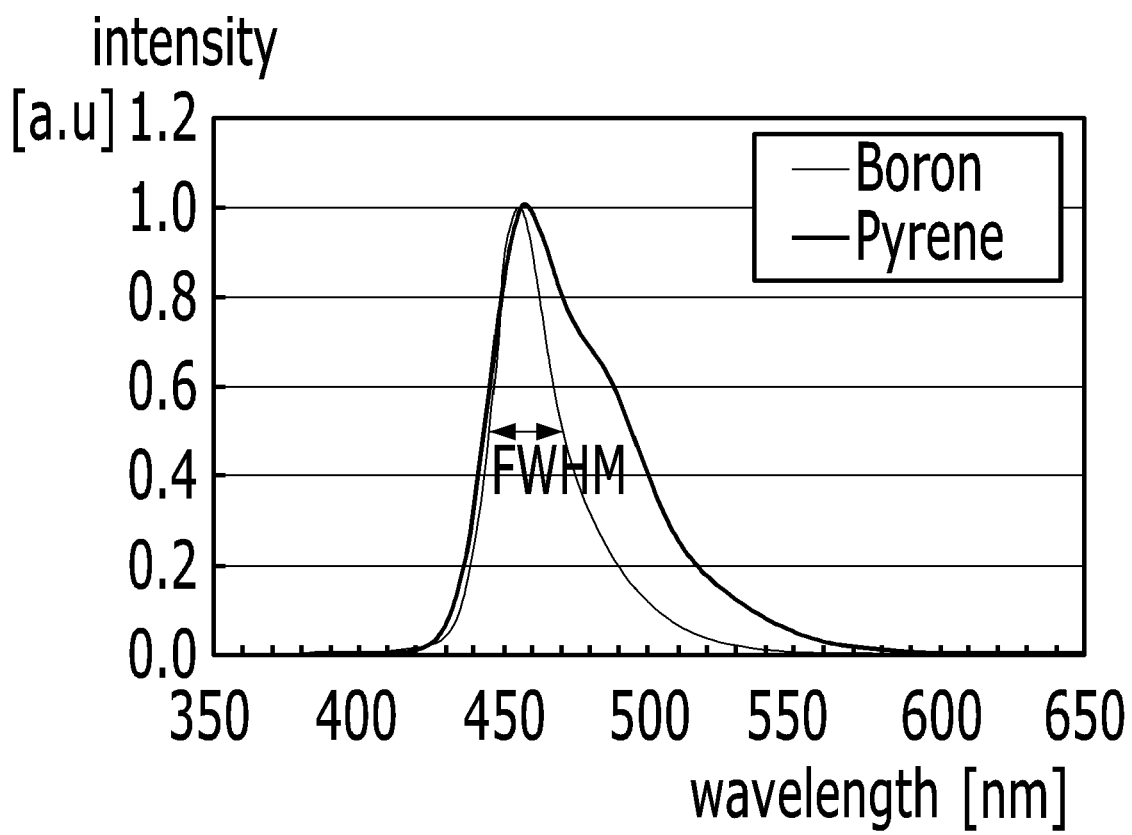
FIG. 2 is a graph representing intensity characteristics of boron-based and pyrene-based blue dopants according to wavelength.

FIG. 2 is a graph representing intensity characteristics of boron-based and pyrene-based blue dopants according to wavelength.

FIG. 2 represents the boron-based blue dopant and the pyrene-based blue dopant, i.e., representative blue dopants having different FWHM characteristics.

Although FIG. 2 illustrates the two dopants having the same peak wavelength, the boron-based blue dopant has a FWHM of 20 nm to 35 nm, and represents blue light emitting characteristics in a narrower wavelength range than the pyrene-based blue dopant having a FWHM of about 50 nm.

Although FIG. 2 illustrates the boron-based blue dopant as having a FWHM of about 25 nm, the FWHM of the boron-based blue dopant may be adjusted to be within the range of 20 nm to 35 nm by adjusting substituents of the boron-based blue dopant.

The boron-based blue dopant employs a compound having a structure in which boron and nitrogen resonate, as expressed in chemical formula 1 or 2. The compound expressed in chemical formula 2 is acquired by introducing biphenyl amine and phenyl into DABNA-1 expressed in chemical formula 1 as substituents.

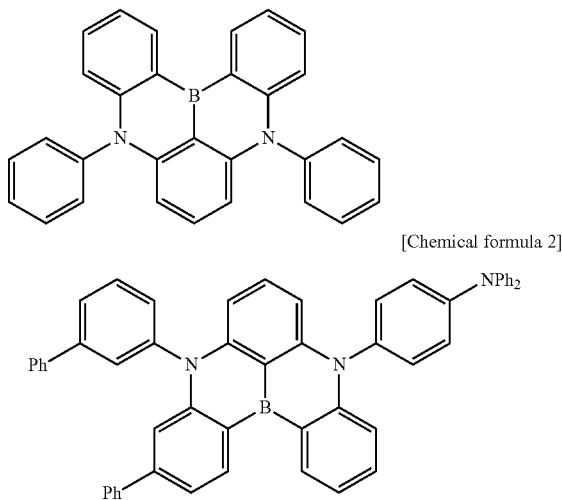

[Chemical formula 1]

[Chemical formula 2]

As such, the organic light emitting device array in accordance with the present disclosure may use filtering characteristics of a luminescent material itself using a blue dopant having light emitting characteristics in a narrow wavelength range, such as the boron-based blue dopant, provided in the first light emitting layer 140, without a color filter layer provided on an emitting surface, i.e., the second electrode 190.

Further, in addition to the above-described boron-based blue dopant, any dopant material which may have light emitting characteristics in a narrow wavelength range, i.e., in a FWHM of 20 nm to 35 nm, may be used, and thus, the same color filter may be omitted.

Figure 3:
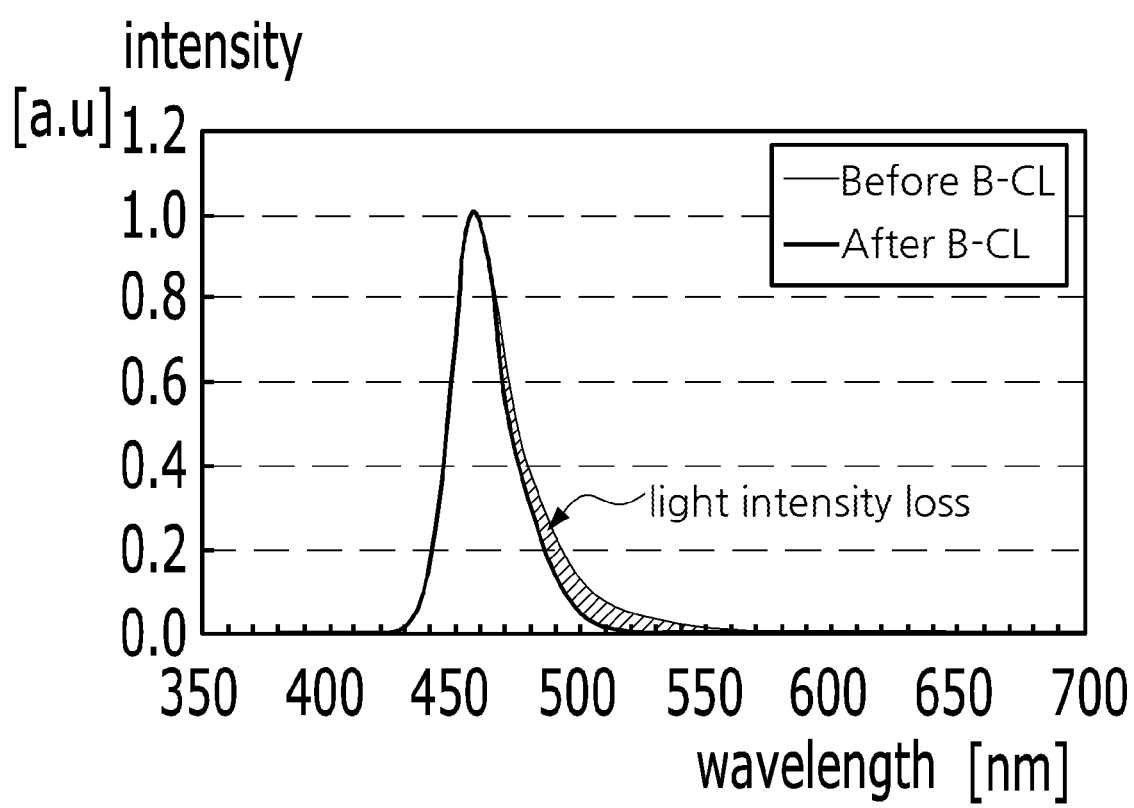
FIG. 3 is a graph representing intensity characteristics of the boron-based dopant according to wavelength if a blue color filter is applied to and not applied to a first subpixel when the boron-based dopant is applied to the organic light emitting device array in accordance with the present disclosure.

FIG. 3 is a graph representing intensity characteristics of the boron-based dopant according to wavelength if a blue color filter is applied to and not applied to the first subpixel when the boron-based dopant is applied to the organic light emitting device array in accordance with the present disclosure.

In the organic light emitting device array in accordance with the present disclosure, a blue dopant having light emitting characteristics in a narrow wavelength range, i.e., in a FWHM of 20 nm to 35 nm, such as the boron-based blue dopant, is used in the first light emitting layer 140, and thus a color filter is omitted from the upper surface of the second electrode 190 of the first subpixel B-S, thereby preventing loss of light intensity generated if light passes through the blue color filter B-CL shown in FIG. 3 and using all the light intensity in blue light emitting display.

TABLE 1

| Presence or absence of blue color filter | Luminance (Cd/A) | CIEx | CIEy | Effective efficiency [Cd/A*CIEy] |
|---|---|---|---|---|
| Absence (using boron-based bd) | 5.73 | 0.147 | 0.046 | 125 |
| Presence (using boron-based bd) | 2.91 | 0.146 | 0.033 | 89 |

TABLE 2

| Presence or absence of blue color filter | Luminance (Cd/A) | CIEx | CIEy | Effective efficiency [Cd/A*CIEy] |
|---|---|---|---|---|
| Absence (using pyrene-based bd) | 9.16 | 0.142 | 0.082 | 111 |
| Presence (using pyrene-based bd) | 3.50 | 0.140 | 0.047 | 75 |

Table 1 states luminances and color coordinate characteristics of the boron-based dopant used as the blue dopant according to whether or not a blue color filter is applied to the first subpixel, and Table 2 states luminances and color coordinate characteristics of the pyrene-based dopant used as the blue dopant according to whether or not a blue color filter is applied to the first subpixel.

Since blue light may be expressed in deep blue only if it should have sufficiently low luminance as well a CIEy value of the color coordinates, a value acquired by dividing luminance (Cd/A) by the CIEy value of the color coordinates is defined as effective efficiency.

Referring to Table 1, if the boron-based blue dopant having a narrow FWHM is used as the blue dopant, when the blue color filter is used, the CIEy value of the color coordinates of blue light is severely changed and lowering of luminance of blue light is two times lowering of luminance of blue light when no blue color filter is used. Further, when the blue color filter is used, the CIEy value of blue light is 0.033, this means that blue light may be expressed in deep blue, but is close to an ultraviolet range and thus has reduced visibility, and it may be confirmed that, if the boron-based blue dopant is used as the blue dopant, when the blue color filter is used, luminance of blue light is lowered and visibility of blue light is reduced. That is, as in the organic light emitting device array in accordance with the present disclosure, when the boron-based blue dopant exhibiting light emitting characteristics in a narrow wavelength range is used as the blue dopant applied to the first light emitting layer, the blue color filter may be omitted from an upper side of the first subpixel, and thus enhancement in luminance of blue light, reduction in a material for the color filter and increase in visibility of blue light may be simultaneously acquired.

Referring to FIG. 2, if the pyrene-based blue dopant having general FWHM characteristics is used as the blue dopant, when the blue color filter is used, the CIEy value of blue light is 0.047 and thus blue light may be expected to be expressed in deep blue, but, in this case, it may be confirmed that lowering of luminance of blue light is more than two times lowering of luminance of blue light when no blue color filter is used. However, it may be understood that, in order to express blue light emitted by the blue subpixel in deep blue in consideration of purity of blue, use of the blue color filter is essential when the pyrene-based blue dopant is used as the blue dopant.

Combining tables 1 and 2, if the blue dopant emitting deep blue light and having light emitting characteristics in a narrow wavelength range like the boron-based blue dopant is used, even when no color filter is used, effective efficiency of blue light is 125 which is improved by 65% or more, as compared to effective efficiency of 75 if the pyrene-based blue dopant and the blue color filter are used, and thus it may be understood that the structure of the organic light emitting device array in accordance with the present disclosure is optically excellent as compared to a structure in which a general blue light emitting layer is applied to a white organic stack or a structure in which a blue color filter is applied to the upper surface of a second electrode. That is, when the organic light emitting device array in accordance with the present disclosure is applied, purity of emitted blue light may be enhanced and high efficiency of blue light may be achieved.

Now, referring to Table 3, the reason why the red color filter is required in the third subpixel will be described.

TABLE 3

| Presence or absence of red color filter | Luminance (Cd/A) | CIEx | CIEy |
|---|---|---|---|
| Absence | 28.7 | 0.480 | 0.239 |
| Presence | 18.3 | 0.674 | 0.311 |

Table 3 states luminances and color coordinates of light emitted by the third subpixel in which, in the white organic stack, the first light emitting layer uses the boron-based blue dopant, as stated in Table 1 above, and the second light emitting layer and the third light emitting layer respectively use a green dopant and a red dopant, according to whether or not the red color filter is applied to the third subpixel. As stated in Table 3, if no red color filter is used, it may be confirmed from CIEx and CIEy values of color coordinates that blue wavelength interference occurs, and thus, pure red light is not emitted from the third subpixel (red subpixel) and light of a color close to purple is emitted. Therefore, in the organic light emitting device array in accordance with the present disclosure, the red color filter is provided in the third subpixel and filters out blue light from light emitted from the third subpixel.

Table 4 states luminances and color coordinates of light emitted by the second subpixel in which, in the white organic stack, the first light emitting layer uses the boron-based blue dopant, as stated in Table 1 above, and the second light emitting layer and the third light emitting layer respectively use a green dopant and a red dopant, according to whether or not a green color filter is applied to the second subpixel.

TABLE 4

| Presence or absence of green color filter | Luminance (Cd/A) | CIEx | CIEy |
|---|---|---|---|
| Absence | 63.3 | 0.280 | 0.680 |
| Presence | 59.5 | 0.268 | 0.696 |

As stated in Table 4, CIEx and CIEy values of color coordinates are slightly different according to whether or not the green color filter is applied to the second subpixel, but, even if the green color filter is not applied to the second subpixel, the CIEx and CIEy values are not out of a range of emitting green light. That is, results stated in Table 4 mean that, even if the green color filter is not applied to the second subpixel as in the organic light emitting device array in accordance with the first aspect of the present disclosure, green light having excellent visibility and luminance characteristics may be emitted. According to the results of the above-described Tables 1 to 4, even if the red color filter is provided only in the third subpixel having interference of light of another short wavelength by the influence of a long wavelength, the respective subpixels may emit light of corresponding colors, i.e., red, green and blue, having high purity and improved luminance.

Hereinafter, a display panel to which the organic light emitting device array in accordance with the first aspect of the present disclosure is applied will be described.

Figure 4:
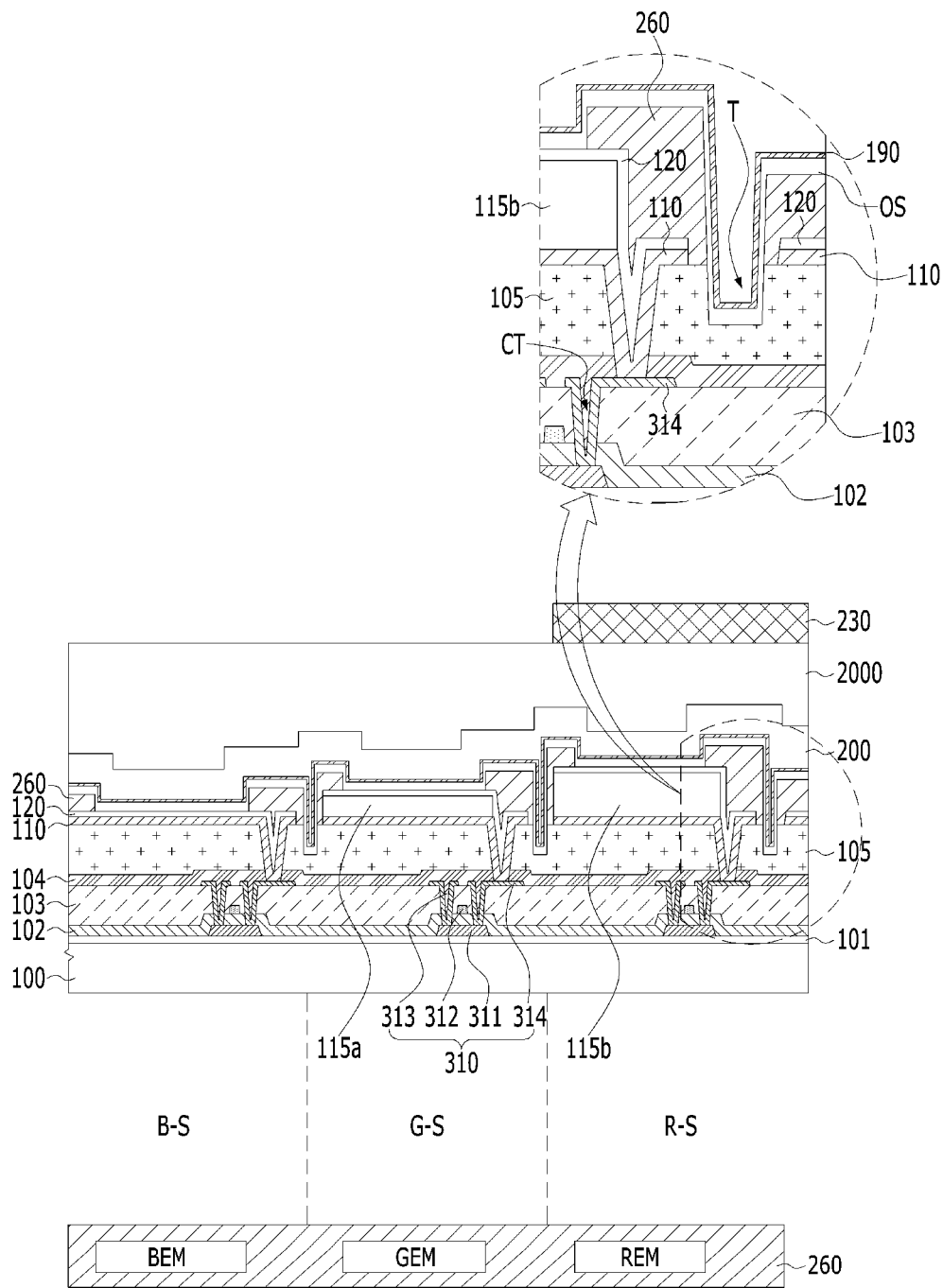
FIG. 4 is a cross-sectional view illustrating a display panel in accordance with the present disclosure.

FIG. 4 is a cross-sectional view illustrating a display panel in accordance with the present disclosure.

As exemplarily shown in FIG. 4, in the display panel in accordance with the present disclosure, a buffer layer 101 may be provided on a substrate 100 having first to third subpixels B-S, G-S and R-S which are regularly arranged, a driving thin film transistor 310 may be provided on the buffer layer 101 in each of the subpixels B-S, G-S and R-S, and the above-described organic light emitting device array shown in FIG. 1 may be provided to be connected to the respective driving thin film transistors 310.

In the display panel in accordance with the present disclosure, the substrate 100 may be, for example, one of a transparent glass substrate, a transparent plastic substrate and a silicon wafer substrate. Further, the substrate 100 may be mounted in a head mounted display device, and be formed of a flexible material having bendability according to the curvature of a receipt part of the head mounted display device.

Further, if the substrates 100 are applied to a head mounted display device which is implemented such that a viewer watches an augmented reality image under the condition that the substrates 100 directly correspond to both of viewer's eyes, the substrates 100 may be transparent.

On the other hand, if the substrates 100 are applied to a head mounted display device which is implemented such that a viewer watches a virtual reality image under the condition that the substrates 100 directly correspond to both of viewer's eyes, the substrates 100 may not be transparent.

If the substrates 100 are received in a head mounted display device under the condition that the substrates 100 do not directly correspond to both of viewer's eyes and correspond to the outsides of the viewer's eyes, the substrate 100 may not be transparent. In some cases, if the substrate 100 employs a silicon wafer substrate, patterns of respective layers may be easily adjusted as fine patterns close to a nanometer-scale.

Here, the respective driving thin film transistors 310 are conductively connected to the corresponding first electrodes 120.

Although the illustrated example shows the reflection plate 110 which is formed of a reflective electrode so that the reflection plate 110 is conductively connected to the first electrode 120, and the driving thin film transistor 310 is actually directly connected to the reflection plate 110, the present disclosure is not limited thereto and, as circumstances require, the reflection plate 110 optically uses only reflectivity, may have no conductivity, and may not be conductively connected to the first electrode 120. Even if the reflection plate 110 is not conductively connected to the first electrode 120, the first to third distances a, b and c from the lower surfaces of the reflection plates 110 to the first electrodes 120 in the first to third subpixels B-S, G-S and R-S are different in the same manner as the above description through FIG. 1.

In the second subpixel G-S and the third subpixel R-S, the first transparent inorganic film 115a and the second transparent inorganic film 115b may be further provided between the reflection plates 110 and the first electrodes 120 so as to adjust the distances between the lower surfaces of the reflection plates 110 and the second electrode 190.

The driving thin film transistor 310 may include a semiconductor layer 311 provided on a designated region of the buffer layer 101, a gate electrode 312 configured to overlap a part of the semiconductor layer 311 with a gate insulating film 102 interposed between the semiconductor layer 311 and the gate electrode 312, and a source electrode 313 and a drain electrode 314 connected to both sides of the semiconductor layer 311.

Although the illustrated example shows a top gate structure in which the gate electrode 312 is located on the semiconductor layer 311, the present disclosure is not limited thereto and a bottom gate structure in which the gate electrode 312 is located under the semiconductor layer 311 may be formed.

Further, the semiconductor layer 311 may be formed of one selected from the group consisting of polysilicon, amorphous silicon, an oxide semiconductor or combinations of some thereof, and, in some cases, the semiconductor layer 311 may be implemented to have a crystalline structure only in regions except for a channel region.

Thereafter, a gate electrode 312 is covered on the upper surface of the gate insulating film 102, an interlayer insulating film 103 is provided on the lower surface of the source electrode 313 and the drain electrode 314, and an inorganic protective film 104 and an organic protective film 105 to cover the source electrode 313 and the drain electrode 314 are sequentially formed on the interlayer insulating film 103.

The source electrode 313 and the drain electrode 314 are connected to the lower semiconductor layer 311 through contact holes CT formed through the interlayer insulating film 103 and the gate insulating film 102.

The organic protective film 105 is formed to have a thickness of 1 μm or more sufficient to offset a step height of the lower configuration, and the surface of the organic protective film 105 may be flat.

Further, the reflection plate 110 formed of at least one selected from the group consisting of aluminum (Al) an Al alloy, silver (Ag), an Ag alloy and APC (Ag:Pb:Cu) to have conductivity is connected to the drain electrode 314 through a contact hole formed through the organic protective film 105 and the inorganic protective film 104.

In the display panel in accordance with the present disclosure, light emitting parts BEM, GEM and REM of the respective subpixels may be divided from one another by a bank 260 configured to surround the respective light emitting parts BEM, GEM and REM. A trench T located between adjacent subpixels is formed up to a part of the thickness of the organic protective film 105 via the bank 260, thus dividing the subpixels from each other. The trenches T are provided to, when a plurality of organic layers forming the white organic stack OS is formed without distinction among the subpixels in a miniaturized and highly integrated device like the display panel in accordance with the present disclosure, reduce deposition of organic material corresponding to vertical parts of the trenches T so as to structurally divide the organic layers according to the subpixels. Even if openings of deposition masks to form the organic layers are not divided according to the subpixels, deposition of the organic material has strong straightness and thus the organic material is not accumulated well in the vertical parts of the trenches T, and thereby, adjacent subpixels may be structurally separated from each other and leakage current between the adjacent subpixels may be prevented.

Further, the bank 260 is formed of an inorganic film, such as an oxide film (SiOx) or a nitride film (SiNx). If the bank 260 is formed of an organic film, it is difficult to control a fine line width, and, if the bank 260 is formed of an inorganic film, a line width not exceeding several μm, moreover, in case of a higher resolution, a nanometer-scale line width may be adjusted.

The details of the white organic stack OS, the second electrode 190, the capping layer 200, the encapsulation layer 2000, the first color filter 230, the first electrode 120 and the reflection plate 110 provided in each of the subpixels B-S, G-S and R-S are the same as the above description through FIG. 1.

The light emitting parts BEM, GEM and REM of the respective subpixels B-S, G-S and R-S are defined as regions inside the bank 260, and may be actual light emitting areas of the respective subpixels B-S, G-S and R-S.

Hereinafter, an organic light emitting device array in accordance with a second aspect of the present disclosure will be described.

Figure 5:
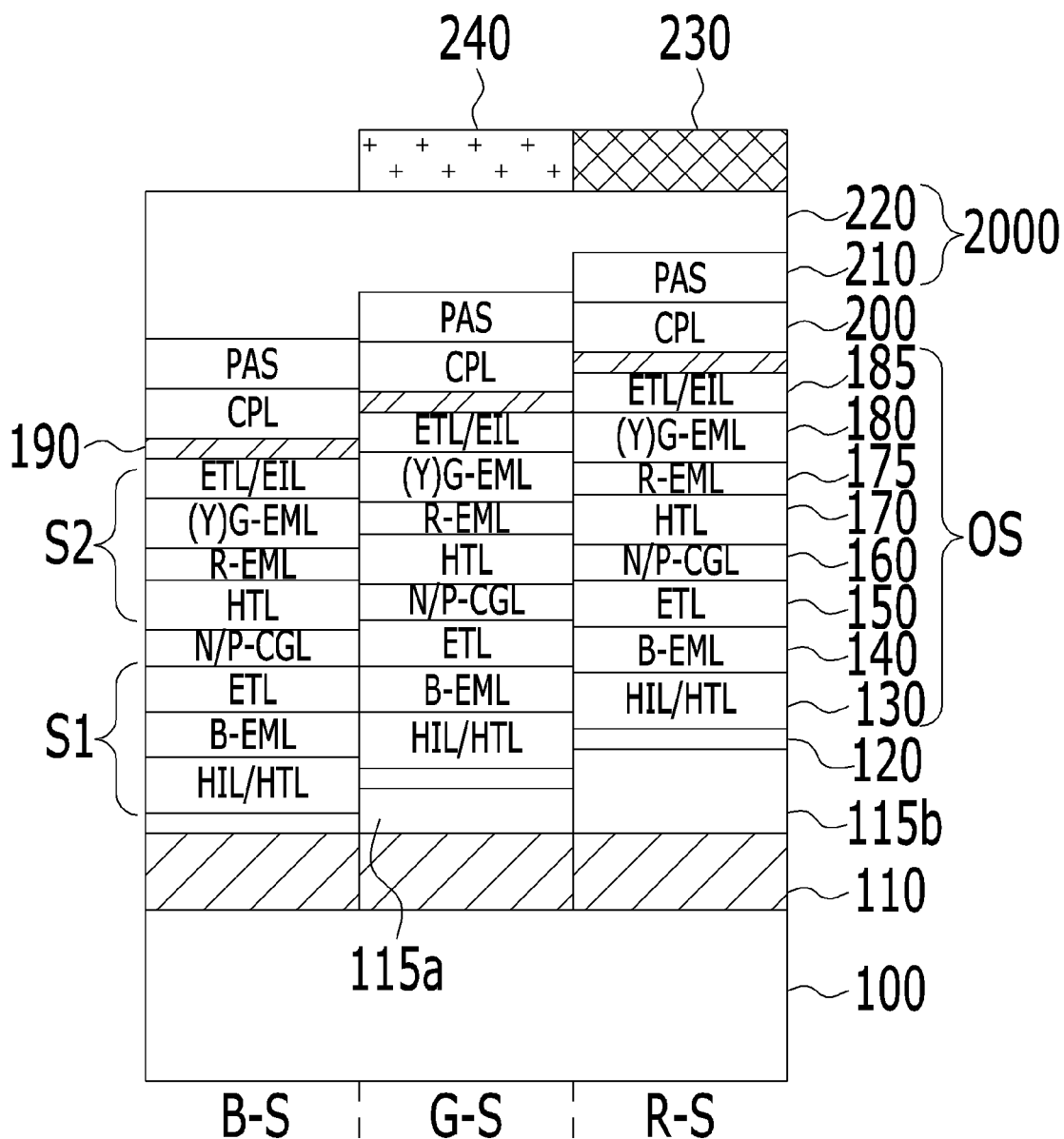
FIG. 5 is a cross-sectional view illustrating an organic light emitting device array in accordance with a second aspect of the present disclosure.

FIG. 5 is a cross-sectional view illustrating the organic light emitting device array in accordance with the second aspect of the present disclosure.

As exemplarily shown in FIG. 5, the organic light emitting device array in accordance with the second aspect of the present disclosure further includes a second color filter 240 corresponding to the second subpixel G-S, as compared to the above-described organic light emitting device array in accordance with the first aspect of the present disclosure.

In this case, the second color filter 240 does not completely block light of other wavelengths than a green peak wavelength, and may increase transmittance by adjusting a light absorbing component included therein.

Figure 6:
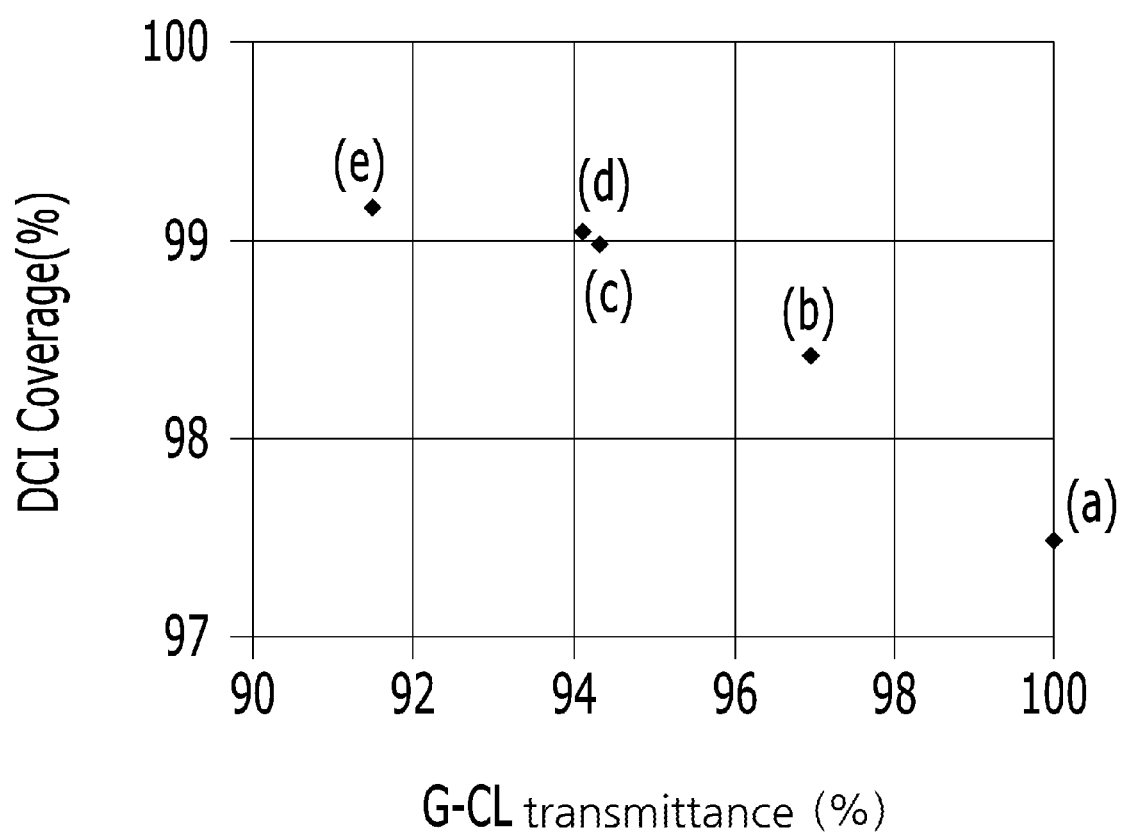
FIG. 6 is a graph representing DCI coverages in several test examples in which transmittance of a green color filter of the organic light emitting device array in accordance with the second aspect of the present disclosure is varied.

FIG. 6 is a graph representing Digital Cinema Initiatives (DCI) coverages in several test examples in which transmittance of a green color filter of the organic light emitting device array in accordance with the second aspect of the present disclosure is varied.

Table 5 below and FIG. 6 represent changes in color coordinates and luminance and change in Digital Cinema Initiatives (DCI) coverage when the transmittance of the green color filter is gradually decreased from first transmittance to fourth transmittance.

DCI coverage is an index representing a color gamut, means a color gamut standard suitable for digital cinema expression in an overall color gamut expressed in red, green and blue, and is included in CIE 1931 standard colorimetric system.

In the test examples, if the green color filter is not applied, transmittance corresponds to 100%, and if the green color filter is applied, first transmittance corresponds to 97%, second transmittance corresponds to 94.2%, third transmittance corresponds to 94% and fourth transmittance corresponds to 91.6%.

Referring to results and DCI coverages of Table 5, it may be understood that, if the green color filter is used and transmittance thereof is gradually decreased, DCI coverage is increased and thus the color gamut is widened. However, since, when the transmittance of the green color filter is decreased, filtering effects are increased and light intensity tends to be decreased, even if the green color filter is applied, the transmittance of the green color filter should be maintained at 85% or more so that a designated level of luminance may be maintained.

TABLE 5

| Test example | Specific | CIEx | CIEy | Luminance (Cd/A) | DCI coverage |
|---|---|---|---|---|---|
| (a) | No color filter | 0.280 | 0.680 | 63.3 | 97.46% |
| (b) | First transmittance of CF | 0.274 | 0.689 | 61.3 | 98.38% |
| (c) | Second transmittance of CF | 0.269 | 0.695 | 59.7 | 98.99% |
| (d) | Third transmittance of CF | 0.268 | 0.696 | 59.5 | 99.04% |
| (e) | Fourth transmittance of CF | 0.263 | 0.701 | 57.9 | 99.15% |

That is, the organic light emitting device array in accordance with the second aspect of the present disclosure includes the green color filter 240 in the second subpixel G-S and the red color filter 230 in the third subpixel R-S, and may have increased DCI coverage while maintaining a similar level of luminance to the organic light emitting device array in accordance with the first aspect of the present disclosure. Increased DCI coverage means extension of the color gamut and increase in the range of an unmixed color expressed in green, and thus means that a viewer may watch an image close to an actual image.

Figure 7:
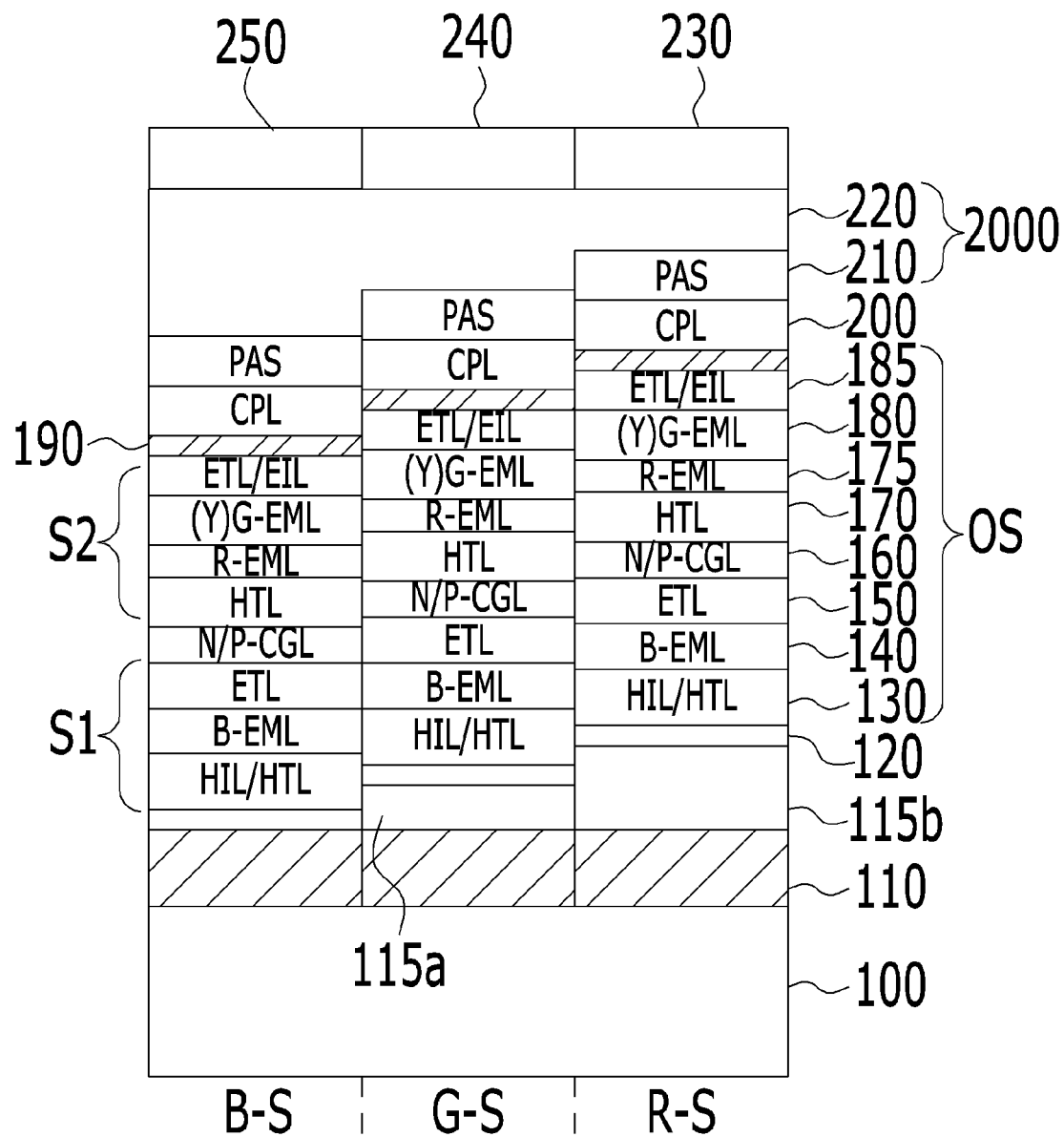
FIG. 7 is a cross-sectional view illustrating an organic light emitting device array in accordance with a third aspect of the present disclosure.

FIG. 7 is a cross-sectional view illustrating an organic light emitting device array in accordance with a third aspect of the present disclosure.

As exemplarily shown in FIG. 7, the organic light emitting device array in accordance with the third aspect of the present disclosure further includes a transparent film 250 having the same thickness as those of the first color filter 230 or the second color filter 240 and provided in the first subpixel (blue subpixel) to prevent a surface step, as compared to the organic light emitting device array in accordance with the second aspect shown in FIG. 5.

If the transparent film 250 is provided, the transparent film 250 has no light absorbing component and thus peak wavelength characteristics of blue light emitted by the first subpixel B-S are maintained. However, the transparent film 250 has transmittance of 85% or more so as to prevent decrease in light intensity in the first subpixel B-S.

In some cases, a cover film may be applied to the upper side of the structure of the first aspect so as to achieve the same purpose, i.e., prevention of a surface step.

Now, various types of head mounted display devices to which the organic light emitting device array and the display panel using the same in accordance with the present disclosure are applied will be described.

Head mounted display devices may have various appearances, i.e., a glasses type, a helmet type, a band type, etc.

Figure 8:
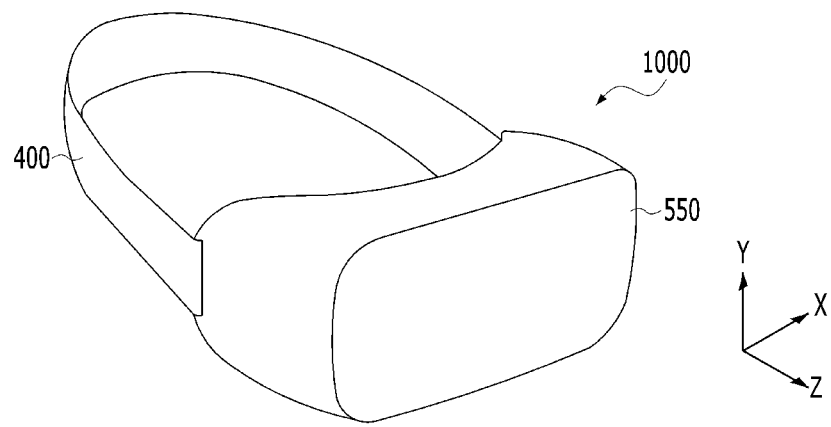
FIG. 8 is a perspective view of a head mounted display device in accordance with an aspect of the present disclosure.
Figure 9:
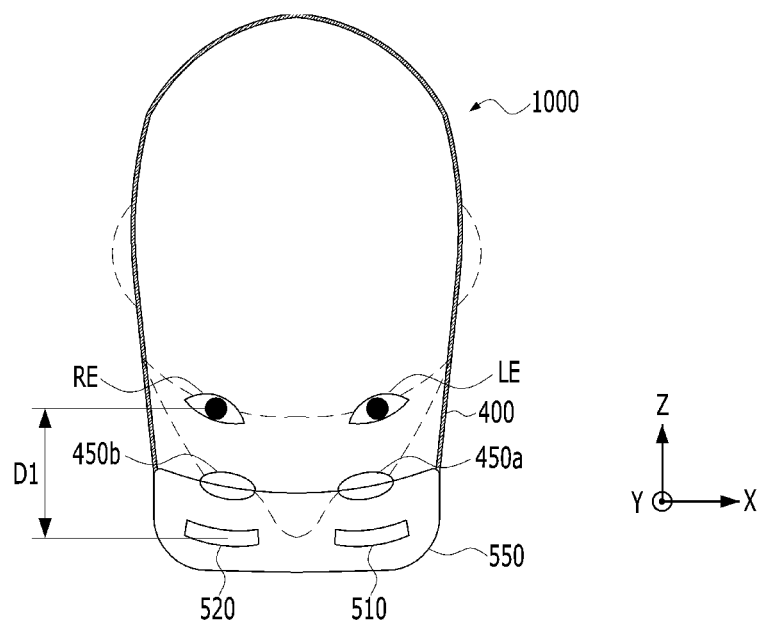
FIG. 9 is a top view of FIG. 8.

FIG. 8 is a perspective view of a head mounted display device in accordance with one aspect of the present disclosure, and FIG. 9 is a top view of FIG. 8.

As exemplarily shown in FIGS. 8 and 9, a head mounted display device 1000 in accordance with one aspect of the present disclosure is formed to have a band 400 in which a viewer may experience virtual reality.

The head mounted display device 1000 includes a receipt structure 550 in which a first display panel 510 and a second display panel 520 corresponding to both of viewer's eyes LE and RE are received, and first and second lens units 450a and 450b provided between the first and second display panels 510 and 520 and the viewer's eyes LE and RE to converge an image on the viewer's eyes LE and RE. The viewer can wear the receipt structure 550 by a head band 400 around the viewer's head.

In this case, since the head mounted display device 1000 is moved together with movement of a viewer's head, a vertical distance D1 between the first and second display panels 510 and 520 and the viewer's eyes LE and RE is the same regardless of movement of the viewer.

Therefore, since a point of view is fixed when the left eye LE views the first display panel 510 and the right eye RE views the second display panel 520, the viewer's eyes LE and RE may view images emitted from the first and second display panels 510 and 520 without viewing angle deviation.

Figure 10:
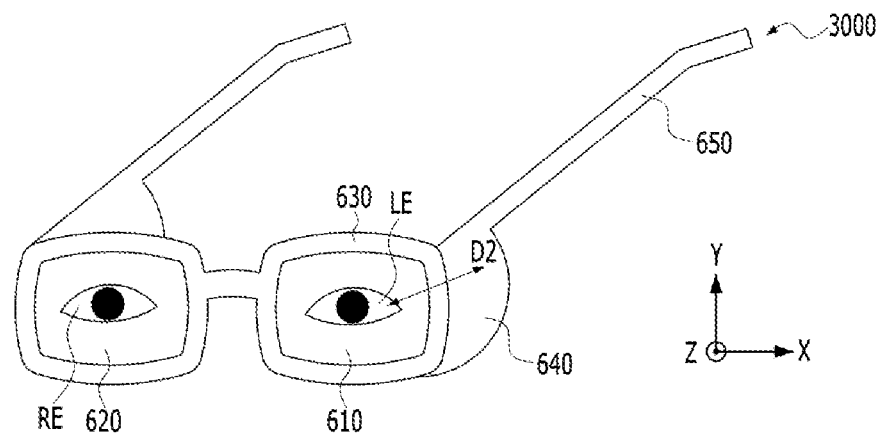
FIG. 10 is a perspective view of a head mounted display device in accordance with another aspect of the present disclosure.
Figure 11:
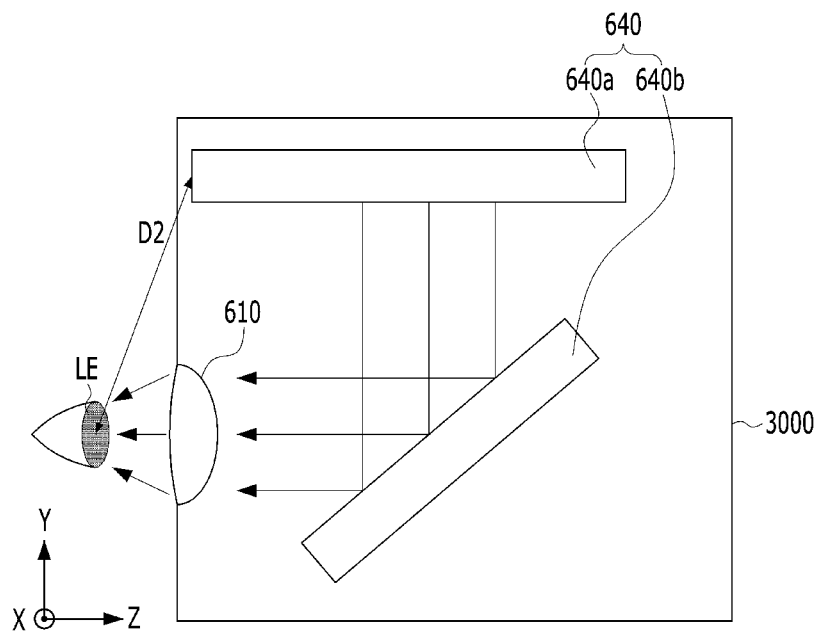
FIG. 11 is a view illustrating relations between the head mounted display device of FIG. 10 and a viewer's eye.

FIG. 10 is a perspective view of a head mounted display device in accordance with another aspect of the present disclosure, and FIG. 11 is a view illustrating relations between the head mounted display device of FIG. 10 and a viewer's eye.

As exemplarily shown in FIGS. 10 and 11, a head mounted display device 3000 in accordance with another aspect of the present disclosure provides augmented reality to a viewer, and is a type in which transparent lenses 610 and 620 are provided to be located in front of viewer's eyes LE and RE so that the viewer may view an external environment through both eyes LE and RE, for example, a glasses type. However, the head mounted display device 3000 is not limited thereto, and may be a helmet type or a band type in which transparent lenses 610 and 620 are provided to be located in front of viewer's eyes LE and RE so that the viewer may watch augmented reality while viewing an external environment.

The head mounted display device 3000 in accordance with another aspect of the present disclosure includes a transparent lens unit including first and second transparent lenses 610 and 620 which are divided from each other in front of the viewer's eyes LE and RE, and a receipt structure 650 having rims 630 to surround the edges of the first and second transparent lenses 610 and 620 and extensions extending from both sides of the rims 630 to be hung on viewer's ears.

Further, image transfer units 640 are mounted on the receipt structure 650, and each image transfer unit 640 includes a display panel 640a located at the same oblique distance at each of both sides of the viewer's eyes LE and RE, and a reflecting mirror 640b configured to transmit an image emitted by the display panel 640a to the corresponding transparent lens 610 or 620.

The above-described head mounted display devices are only examples, and may be variously modified. However, in the head mounted display devices in accordance with the present disclosure, a distance between viewer's eyes and the corresponding display panels is not deviated from a vertical, oblique or horizontal distance, and thus the viewer does not sense viewing angle characteristics with respect to images displayed by the respective display panels.

As apparent from the above description, a head mounted display device and a display panel included therein in accordance with the present disclosure have effects as follows.

The head mounted display device in accordance with the present disclosure varies a distance between a reflection plate and a second electrode using a uniform viewing distance between viewer's eyes and display panels and thus maintains strong cavity characteristics in respective subpixels, thereby implementing different colored light emitting characteristics even if the same white organic stack is provided in the respective subpixels. Therefore, color filters may be omitted, loss of light intensity may be prevented and thus luminance may be improved.

Particularly, since, among red, green and blue light, blue light has the worst luminance characteristics, other colors of light may be excluded from a blue subpixel due to strong cavity characteristics of the blue subpixel by applying a blue dopant which may emit blue light within a narrow wavelength range to a blue light emitting layer, and thus a separate color filter may be omitted from the blue subpixel. Further, enhancement in luminance of the blue subpixel increases luminance of the entire display panel, and, in maintenance of white balance when red, green and blue light is simultaneously emitted, applied current may be reduced and thus lifespan increase may be acquired.

Further, in the head mounted display device in accordance with the present disclosure, in order to prevent color mixing caused by overlapping of the optimal resonance distance of light of a long wavelength with the optimal resonance distance of light of a short wavelength, a color filter may be provided in a subpixel emitting light of the long wavelength.

In the head mounted display device in accordance with the present disclosure, a transparent film having high transmittance and a thickness corresponding to that of the color filter is provided in a specific subpixel provided with no color filter, and may thus prevent a step and improve visibility.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A head mounted display device comprising:
   a display panel comprising,
      first to third subpixels defined at a substrate;
      a reflection plate provided in the first, second and third subpixels;
      first electrodes vertically spaced apart from a lower surface of the reflection plate by a first distance, a second distance and a third distance at the first, second and third subpixels, respectively;
      a white organic stack on the first electrodes at the first, second and third subpixels;
      a second electrode on the white organic stack;
      a first color filter on the second electrode at the third subpixel to transmit light having a wavelength in a range of 600 nm to 650 nm; and
   a receipt structure accommodating the display panel,
   wherein the white organic stack includes a first light emitting layer emitting a blue light, a second light emitting layer emitting a red light and a third light emitting layer emitting a green light or a yellowish green light,
   wherein the first subpixel transmits the blue light emitted from the first light emitting layer with a single strong microcavity characteristics of the white organic stack and the blue light is outputted through the second electrode, and
   wherein the blue light outputted from the second electrode at the first subpixel has higher color purity than other color lights outputted from the second and third pixels.

2. The head mounted display device according to claim 1, wherein the white organic stack comprises:
   a first stack including the first light emitting layer emitting light having a peak wavelength of 435 nm to 475 nm and a first common layer and a second common layer respectively provided under and on the first light emitting layer;
   a charge generation layer contacting the second common layer; and
   a second stack on the charge generation layer and including the second light emitting layer emitting light having a peak wavelength of 600 nm to 650 nm, the third light emitting layer contacting the second light emitting layer and emitting light having a peak wavelength of 500 nm to 590 nm, a third common layer under the second light emitting layer and a fourth common layer on the third light emitting layer.

3. The head mounted display device according to claim 2, wherein a thickness of the white organic stack is m/2 times (m being a integer) a value acquired by dividing a wavelength of light emitted from the first light emitting layer by a refractive index of the white organic stack.

4. The head mounted display device according to claim 2, wherein the first light emitting layer includes a blue dopant that has a full width at half maximum (FWHM) of 20 nm to 35 nm.

5. The head mounted display device according to claim 2, wherein the first light emitting layer includes a boron-based blue dopant.

6. The head mounted display device according to claim 2, further comprising a capping layer and an encapsulation layer stacked on the second electrodes at the first, second and third subpixels, wherein the first color filter contacts the encapsulation layer.

7. The head mounted display device according to claim 1, wherein the substrate is fixed at a designated distance from a viewer's eye.

8. The head mounted display device according to claim 1, wherein the first distance is a thickness of the reflection plate, and the reflection plate and the first electrode contact each other at the first subpixel.

9. The head mounted display device according to claim 8, further comprising a transparent inorganic film provided between the reflection plate and the first electrode at the second subpixel and the third subpixel.

10. The head mounted display device according to claim 1, further comprising a second color filter disposed on the second electrode in the second subpixel and to be coplanar with the first color filter to transmit light of a wavelength of 530 nm to 570 nm.

11. The head mounted display device according to claim 1, further comprising a transparent film having transmittance of 85% or higher and disposed on the second electrode at the first subpixel to be coplanar with the first color filter.

12. The head mounted display device according to claim 1, wherein the display panel comprises a first display panel and a second display panel provided within the receipt structure and correspond to both of viewer's eyes.

13. The head mounted display device according to claim 12, further comprising first and second lens units provided between the first and second display panels and the viewer's eyes to converge images on the viewer's eyes.

14. The head mounted display device according to claim 12, wherein the head mounted display device further comprises first and second reflecting mirrors configured to transmit images emitted by the first and second display panels to the first and second lens units through reflection.

15. The head mounted display device according to claim 1, wherein the substrate includes one of a transparent glass substrate, a transparent plastic substrate and a silicon substrate.

16. The head mounted display device according to claim 1, further comprising driving thin film transistors connected to the first electrodes at the first, second and third subpixels.

17. A display panel comprising:
   first, second and third subpixels defined at a substrate;
   a reflection plate provided in the first, second and third subpixels;
   first electrodes vertically spaced apart from a lower surface of the reflection plate by a first distance, a second distance and a third distance at the first, second and third subpixels, respectively;
   a white organic stack on the first electrodes at the first, second and third subpixels;
   a second electrode on the white organic stack; and
   a first color filter on the second electrode at the third subpixel to transmit light having a wavelength in a range of 600 nm to 650 nm,
   wherein the white organic stack includes a first light emitting layer emitting a blue light, a second light emitting layer emitting a red light and a third light emitting layer emitting a green light or a yellowish green light, and
   wherein the first subpixel transmits the blue light emitted from the first light emitting layer with a single strong microcavity characteristics of the white organic stack and the blue light is outputted through the second electrode without any color filter on the second electrode at the first subpixel.

18. The display panel according to claim 17, wherein the white organic stack comprises:
   a first stack comprising the first light emitting layer emitting light having a peak wavelength of 435 nm to 475 nm and a first common layer and a second common layer respectively provided under and on the first light emitting layer;
   a charge generation layer contacting the second common layer; and
   a second stack on the charge generation layer and comprising the second light emitting layer emitting light having a peak wavelength of 600 nm to 650 nm, the third light emitting layer contacting the second light emitting layer and emitting light having a peak wavelength of 500 nm to 590 nm, a third common layer under the second light emitting layer and a fourth common layer on the third light emitting layer.

19. The display panel according to claim 17, wherein among color lights outputted through the second electrode at the first to third pixels, the blue light outputted from the second electrode at the first subpixel has the most color purity.

20. The display panel according to claim 17, wherein the first light emitting layer includes a boron-based blue dopant based to have filtering characteristic with regard to a light which is transmitted to the white organic stack and then outputted from the second electrode.

* * * * *